United States Patent
Kim et al.

(10) Patent No.: US 10,410,959 B2
(45) Date of Patent: Sep. 10, 2019

(54) LEAD PACKAGE AND METHOD FOR MINIMIZING DEFLECTION IN MICROELECTRONIC PACKAGING

(71) Applicant: Kyocera International, Inc., San Diego, CA (US)

(72) Inventors: Franklin Kim, San Diego, CA (US); Mark Eblen, Temecula, CA (US); Shinichi Hira, San Diego, CA (US)

(73) Assignee: Kyocera International, Inc., San Diego, CA (US)

( * ) Notice: Subject to any disclaimer, the term of this patent is extended or adjusted under 35 U.S.C. 154(b) by 0 days.

(21) Appl. No.: 16/015,631

(22) Filed: Jun. 22, 2018

(65) Prior Publication Data

US 2018/0374781 A1 Dec. 27, 2018

Related U.S. Application Data

(60) Provisional application No. 62/523,977, filed on Jun. 23, 2017.

(51) Int. Cl.
| | |
|---|---|
| *H01L 23/495* | (2006.01) |
| *H01L 23/367* | (2006.01) |
| *H01L 21/48* | (2006.01) |
| *H01L 23/08* | (2006.01) |
| *H01L 23/04* | (2006.01) |
| *H01L 23/538* | (2006.01) |
| *H01L 23/36* | (2006.01) |

(52) U.S. Cl.
CPC .... *H01L 23/49541* (2013.01); *H01L 21/4839* (2013.01); *H01L 21/4871* (2013.01); *H01L 23/041* (2013.01); *H01L 23/08* (2013.01); *H01L 23/36* (2013.01); *H01L 23/367* (2013.01); *H01L 23/5389* (2013.01); *H01L 2223/6644* (2013.01); *H01L 2224/48091* (2013.01); *H01L 2224/48247* (2013.01); *H01L 2924/15* (2013.01)

(58) Field of Classification Search
CPC .......... H01L 23/49541; H01L 21/4839; H01L 21/4871; H01L 23/041; H01L 23/36; H01L 23/367; H01L 2224/48091; H01L 2224/48247; H01L 23/5389; H01L 2223/6644; H01L 2924/15
See application file for complete search history.

(56) References Cited

U.S. PATENT DOCUMENTS

| | | | |
|---|---|---|---|
| 6,559,533 B1 * | 5/2003 | Yamamoto | H01L 23/10 257/705 |
| 9,331,000 B2 | 5/2016 | Eblen et al. | |

* cited by examiner

*Primary Examiner* — Feifei Yeung Lopez

(57) ABSTRACT

Package deflection and mechanical stress of microelectronic packaging is minimized in a two step manufacturing process. In a first step, a ceramic insulator is high-temperature bonded between a wraparound lead layer and a buffer layer of a same material as the lead layer to provide a symmetrically balanced three-layer structure. In a second step, the three-layer structure is high temperature bonded, using a lower melt point braze, to a heat spreader. This package configuration minimizes package deflection, and thereby improves thermal dissipation and reliability of the package.

20 Claims, 6 Drawing Sheets

LEAD PACKAGE AND METHOD FOR MINIMIZING DEFLECTION IN MICROELECTRONIC PACKAGING

RELATED APPLICATIONS

This application claims the benefit of U.S. Provisional Patent Application Ser. No. 62/523,977, filed on Jun. 23, 2017, and incorporated herein in its entirety.

FIELD

This invention generally relates to electronic packaging and more particularly to management of thermal energy transfer and deflection mitigation in microelectronic packaging.

BACKGROUND

Microelectronic packaging for high power semiconductor devices must increase the thermal conductivity of its integrated heat spreader for improved thermal dissipation of heat produced by high power semiconductor devices housed within the microelectronic packaging and seated on the heat spreader.

Microelectronic packaging (referred to herein as "a package") typically includes a stacked configuration of a heat spreader, a substrate material (i.e. an electrical insulator) that is high-temperature-brazed to the heat spreader, and leads that are high-temperature-brazed to the heat spreader. A thermal expansion mismatch between the electrical insulator and the heat spreader manifests as excessive package deflection. Excessive package deflection (i.e., camber) contributes to high bending (i.e., flexural) mechanical stress in the insulator which may cause fractures of the insulator. More specifically, during cooling of the brazed assembly, the thermal expansion difference between the heat spreader and the insulator may cause excessive deflection of the package which results in the package being more vulnerable to brittle fractures.

In addition, excess package deflection decreases the surface area of the package that is in contact with a second level assembly. Therefore, thermal pathways extending from the high power semiconductor devices, through the heat spreader and into the second level assembly are reduced and/or are not direct. As such, the heat dissipation of the package decreases, and the effectiveness of the heat spreader is reduced.

A variety of efforts have been made to address the large differential between the Coefficient of Thermal Expansion (CTE) of the heat spreader and the CTE of the insulator to decrease deflection. For example, CPC (copper-moly/copper-copper) laminate heat spreaders are cost effective, and provide a good thermal expansion and a better match to the CTE of the insulator. However, these heat spreaders have proven to be too low in thermal conductivity which inhibits thermal energy transfer.

SUMMARY

A wraparound lead package includes an insulator that is high-temperature-brazed between a wraparound lead layer and a buffer lead layer in a first process step. In one example, the wraparound lead layer and the buffer lead layer are comprised of the same material. The first process step minimizes deflection in the three-layer structure, i.e., the lead-insulator-buffer assembly. The lead-insulator-buffer assembly then is high-temperature-brazed to a heat spreader, and the minimized deflection of the wraparound lead package is maintained.

BRIEF DESCRIPTION OF THE DRAWINGS

It is to be understood that the drawings are solely for a purpose of illustration and do not define the limits of the invention(s). Furthermore, the components in the figures are not necessarily to scale. In the figures, like reference numerals designate corresponding parts throughout the different views.

DETAILED DESCRIPTION

To alleviate excessive package deflection and mechanical stress, a wraparound electrical lead design with a same, or closely similar, material buffer is high temperature bonded to both sides of an insulator in a first step of a two-step manufacturing process. This first step provides a symmetrically balanced three-layer structure. In a second step, the partial assembly, i.e., the three-layer structure, is high temperature bonded to a heat spreader using a lower melt point braze. This package configuration minimizes package deflection and insulator fracture, and thereby improves thermal dissipation and reliability of the package.

Figure 1:
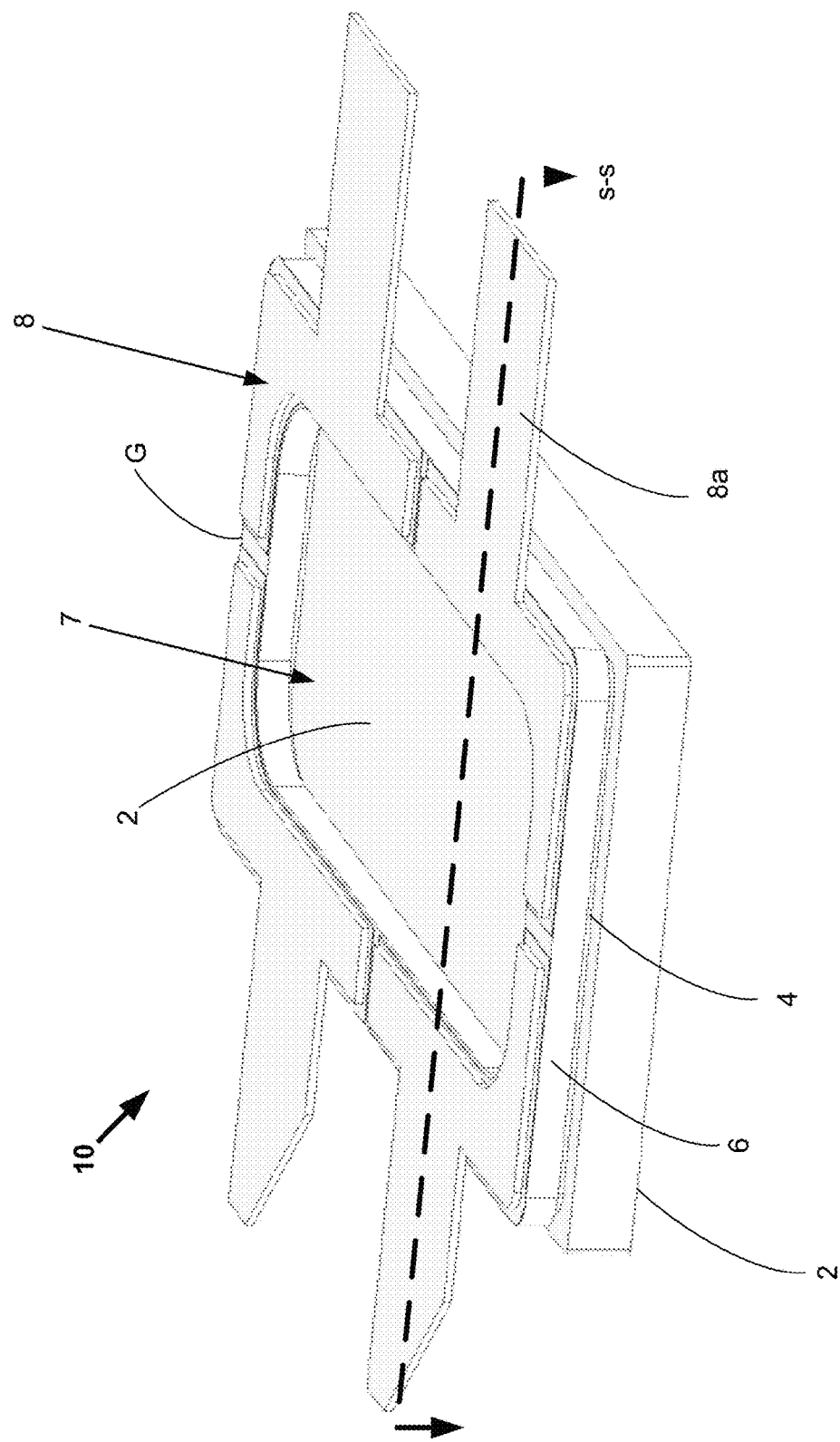
FIG. 1 is a perspective view of a wraparound lead package.
Figure 2:
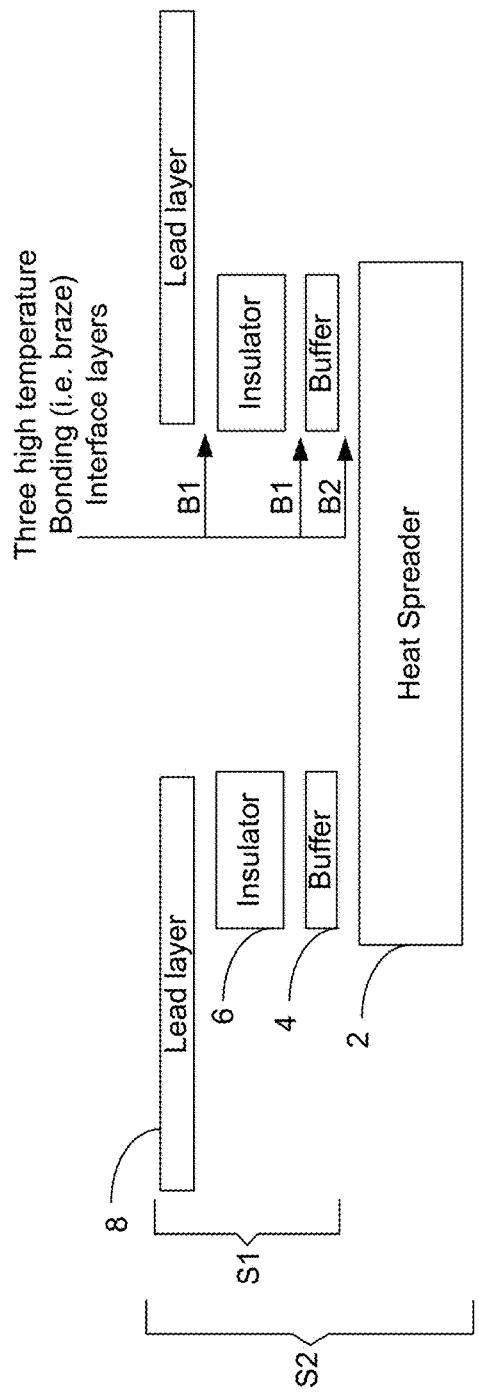
FIG. 2 illustrates an exploded sectional view along s-s of FIG. 1 for a manufacturing process of a wraparound lead package.

FIG. 1 is a perspective view of an example wraparound lead package having four leads, and FIG. 2 illustrates an exploded sectional view along s-s of FIG. 1 for a manufacturing process of a wraparound lead package. Other example packages (not shown) may have two leads, only. Other packages (not shown) may have more than four leads, and may have leads positioned along any side or corner of the packages. The lead layer 8 includes base portions of the leads 8a, that is, the portions of the leads 8a that are braze-attached to the insulator 6, that are extended to cover an upper surface of the insulator 6. That is, the lead layer 8 wraps-around the corners of the insulator. The leads 8a are separated by a gap G that is sufficient to electrically isolate the leads from one another.

A buffer layer 4 is positioned below the insulator 6. A rectangular, three-layer structure is formed when the insulator 6 is high-temperature-brazed between the wraparound lead layer 8 and a buffer layer 4. The lead layer 8 and the buffer 4 consist of the same electrically conductive material, and have a same, or nearly same, thickness. Example lead materials include FeNi controlled expansion alloy and Ni. Lead layer 8 and buffer 4 of one example have a thickness of 3 to 6 mils.

The cut-out center portion 7 of the insulator 6 provides a cavity area for seating electronic devices directly on the heat spreader 2. The structure around the cavity is also referred to as a ceramic window frame, which is rectangular or square in shape with an open space, i.e. a cut-out section or window in a middle portion of the ceramic insulator frame 6. As described below, a two step process for manufacturing the lead package minimizes deflection (camber) of the package 10 to provide a desired flat bottom surface of the heat spreader. A flat bottom surface of the heat spreader 2 is desirable in order to provide maximum heat dissipation from the electronic devices, through the heat spreader and into a second level assembly. Exemplary heat spreaders are made of materials having thermal conductivity in excess of 300 W/mK, e.g. Copper—Molybdenum—Copper laminates. An example heat spreader has a room temperature CTE in excess or 12.0 ppm/K. Example insulators 6 are manufactured from high purity Al2O3 ceramic materials having higher CTEs of up to 7.2 ppm/K. FIGS. 1-6 illustrates heat spreaders 2 as being constructed from a single monolithic layer of material. However, in other packages 10 the heat spreaders 2 may have up to five discrete layers joined together.

Figure 3:
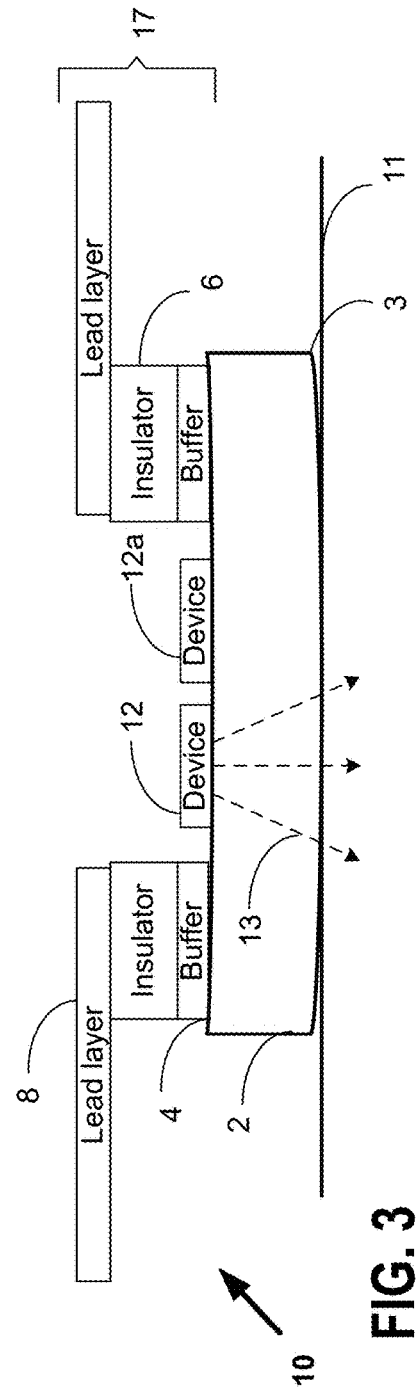
FIG. 3 illustrates a sectional view of a completed manufacturing process of a wraparound lead package.

As shown in FIG. 2, an example wraparound lead package is manufactured in two steps, S1 and S2. In step S1, the wraparound lead layer 8 (lead layer) and the buffer layer 3 are bonded to the insulator 6 using a first high temperature melt point braze B1. The footprint of the wraparound lead layer 8 that it brazed to the insulator 6 essentially matches the footprint of the buffer layer 4, exclusive of the aforementioned gaps in the lead layer. Referring to FIG. 3, the three-layer structure 17 is symmetrical, and the after-braze cooling process results in a flat, or a nearly flat, three-layer assembly 17. That is, the deflection of the three-layer structure 17 is minimized because the cooling contraction of the wraparound lead 8 (that pulls the assembly 17 into and upward camber), counteracts the cooling contraction of the buffer 4 (that pulls the assembly 17 into a downward camber). The symmetrical structure of the three-layer structure 17 minimizes convex or concave camber of the insulator, and thus minimizing fracture of the insulator.

In step S2, the three-layer assembly 17 is high temperature bonded to the heat spreader 2 using a second braze B2 that has a second high temperature melt point that is lower that the first high temperature melt point braze B1. The stiffness of the three-layer assembly 17 counteracts the cooling contraction of the heat spreader 2, and deflection in the resulting lead package 10 is minimized, e.g. to no more than a slight upward camber 3 as illustrated in FIG. 3.

As illustrated in FIG. 3, direct thermal paths 13 are available from the high power semiconductor devices 12 through the heat spreader 2 and into the second level assembly 11. That is, an essentially flat, or minimally convex bottom surface of the heat spreader 2 provides maximum contact between the package 10 and the second level assembly 10

For illustrative purposes, a single high power device 12 is shown. Device 12a illustrates passive devices, e.g., capacitors, that do not generate heat and used for RF impedance matching.

Figure 4:
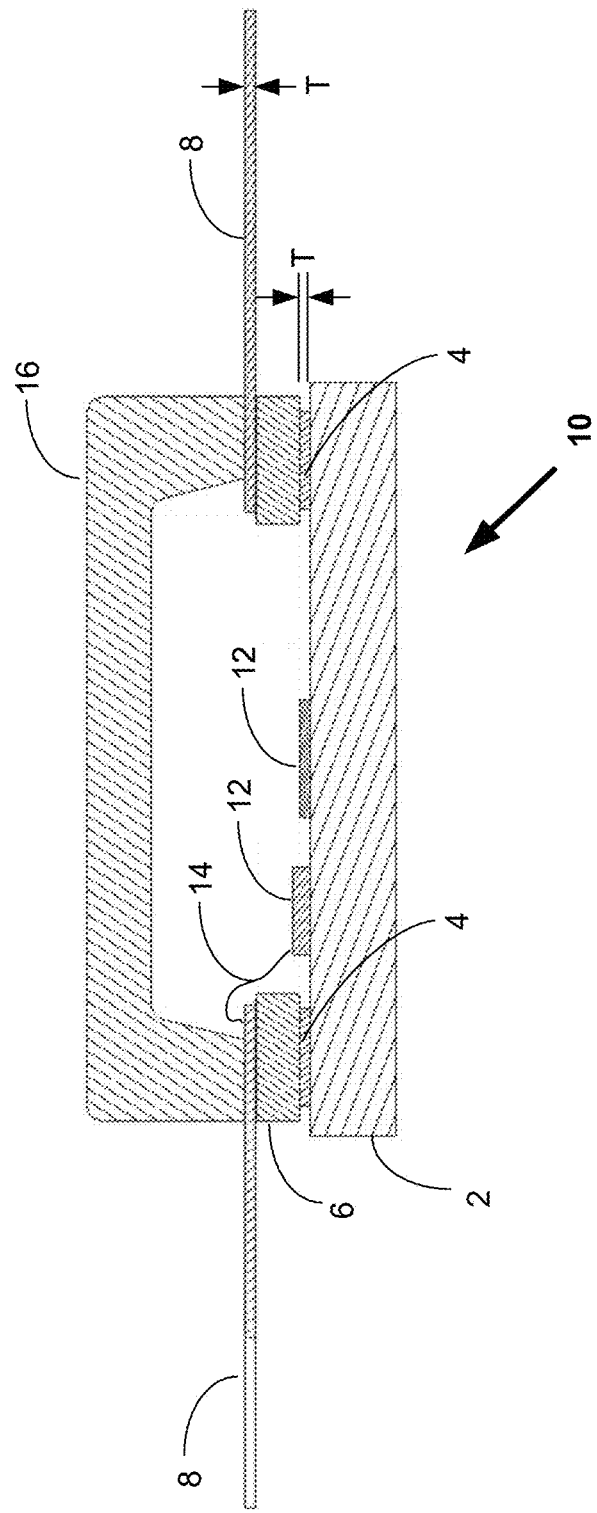
FIG. 4 is a cross section view along s-s of FIG. 1 of a wraparound lead package with a ceramic lid enclosing electronic devices.

FIG. 4 is a cross section view along s-s of FIG. 1 of a wraparound lead package 10 with a ceramic lid 16 enclosing electronic devices 12. A lid 16 secures and isolates the devices 12 from environmental contamination. Lids 16 are attached after the devices 12, 12a are attached and wire-bonded to leads 8. The lid to lead/insulator interface is a one component B-staged epoxy which is typically printed along the bottom of the lid 16. As shown in the cross section view, the leads 8 and the buffer 4 have a same material thickness T. As described above, a same, or nearly same, thickness T of the leads 8 and the buffer 4, minimizes camber of the three-layer structure during a first step S1 braze process. Wire bonds 14 connect the devices 12 to the leads 8. The insulator 6 provides an electrical isolation between the leads 8 and the buffer 4/heat spreader 2.

Figure 5:
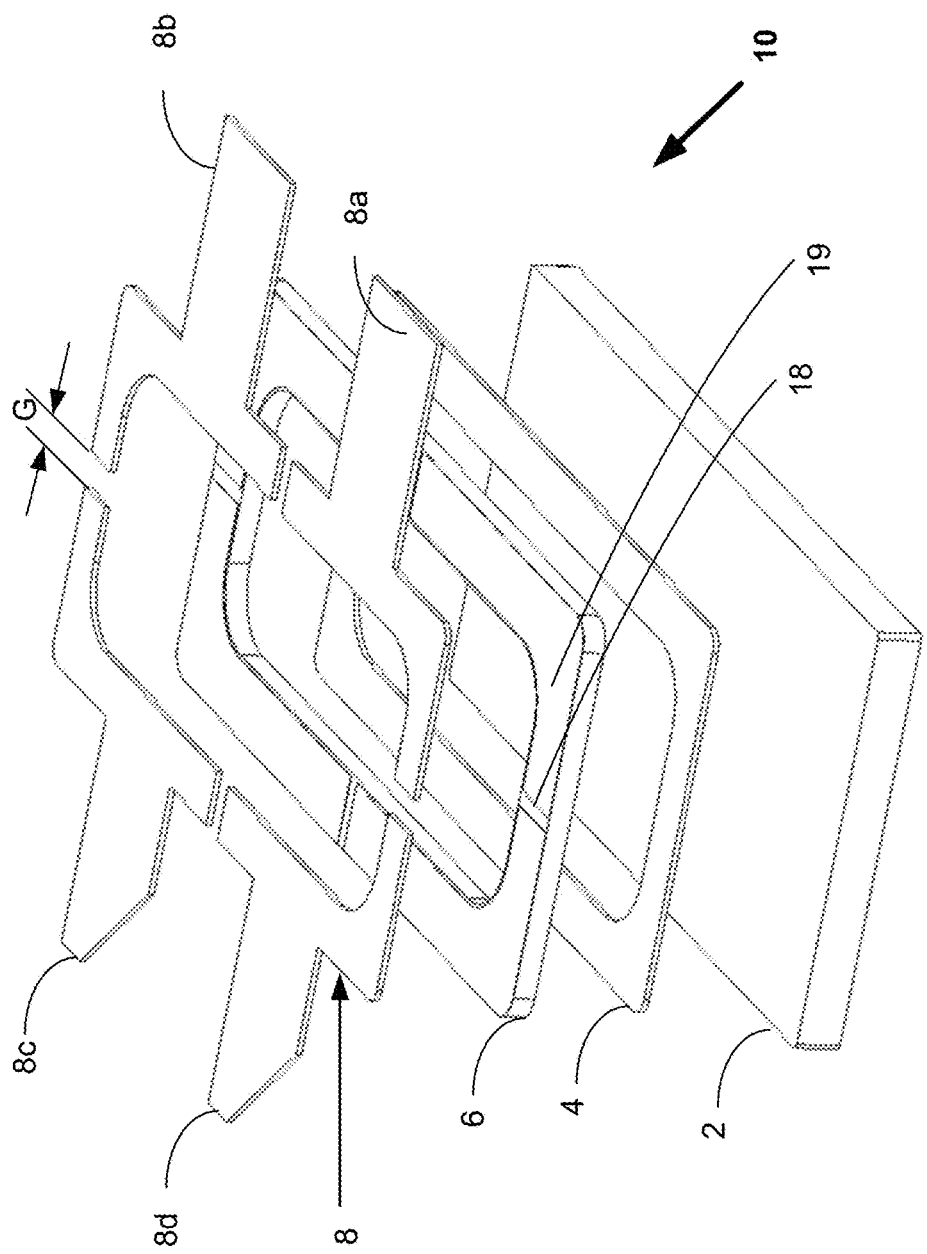
FIG. 5 is an exploded view of a wraparound lead package.
Figure 6:
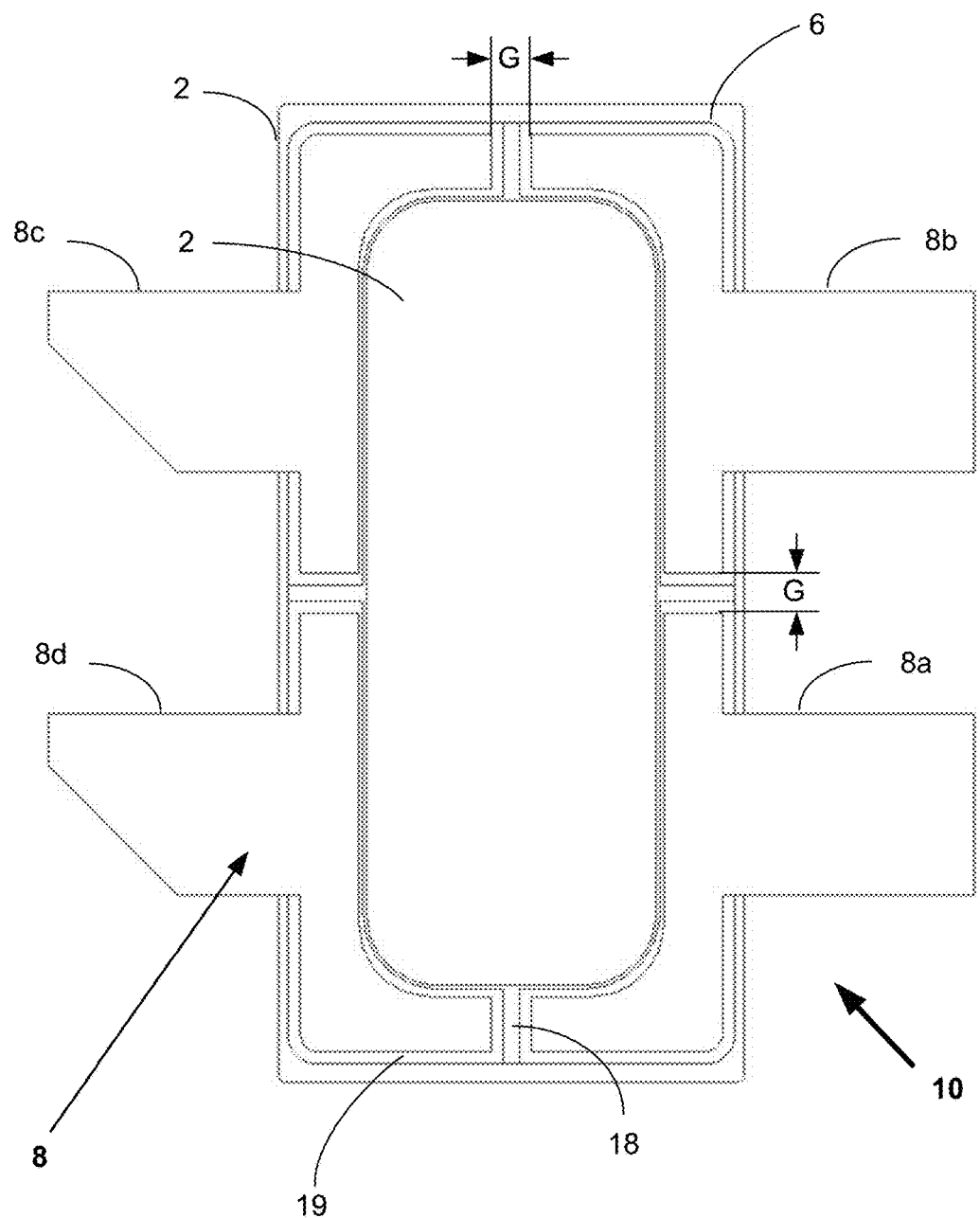
FIG. 6 is a top view of a wraparound lead package.

FIG. 5 is an exploded view of the wraparound lead package 10, and FIG. 6 is a top view of the package 10. As illustrated, a wraparound lead layer 8 is formed from four separate sections, 8a, 8b, 8c and 8d. The leads adjacent each corner of the package 10 wrap around, i.e. extend around, a corner portion corresponding to a top surface of an insulator 4. In the illustrated example of a four-lead package 10, each lead 8a, 8b, 8c and 8d extend from a center of one side of the insulator 4 to a center of an adjacent side of the insulator 4. In a two-lead example (not shown), a first lead will wrap around two corners of the top surface of the insulator 4. For a multiple-lead package (not shown), only the corner leads adjacent to corners will wrap around the corner portions of the package 10. Other leads positioned between the corner leads need only be symmetrical with the opposing leads so that during assembly braze cool down a symmetrical mechanical forces are exerted on the insulator 6. As shown in FIGS. 5 and 6, a gap G between the corner leads is of a sufficient width to ensure electrical isolation and to prevent arcing. A typical gap G ranges from 10 to 20 mils, and is based on a size of the package, a thermal-mechanical balance between the top metal area and bottom metal area, and an electrical isolation requirement.

FIGS. 5 and 6 show an embodiment of the ceramic insulator 6 that includes a metallization high temperature sintered to the ceramic insulator. The metallization pattern 19 extends slightly beyond the lead 8 foot print to form a small braze fillet. A metallization-to-metallization separation 18 of the metallization pattern 19 is shown and will vary in width depending on materials used for the metallization pattern 19. For example, a MoMn metallization pattern 19 may use a nominal separation 18 of 14 mils +/−2 mils. The metallization pattern 19 is screen print on the insulator 6 (topside with gaps, and full bottom side), then high temperature sintered to the insulator 6. The metallization pattern provides a strong adherence agent for the lead layer 8 during the braze process. In one example, the braze B1 is AgCu.

In other packages 10, active metal brazing using AgCuTi may be used in the first step brazing process eliminating the metallization. However, the adhesion for active metal braze produces a weak bond of the lead layer 8 to the ceramic insulator 6.

Figure 7:
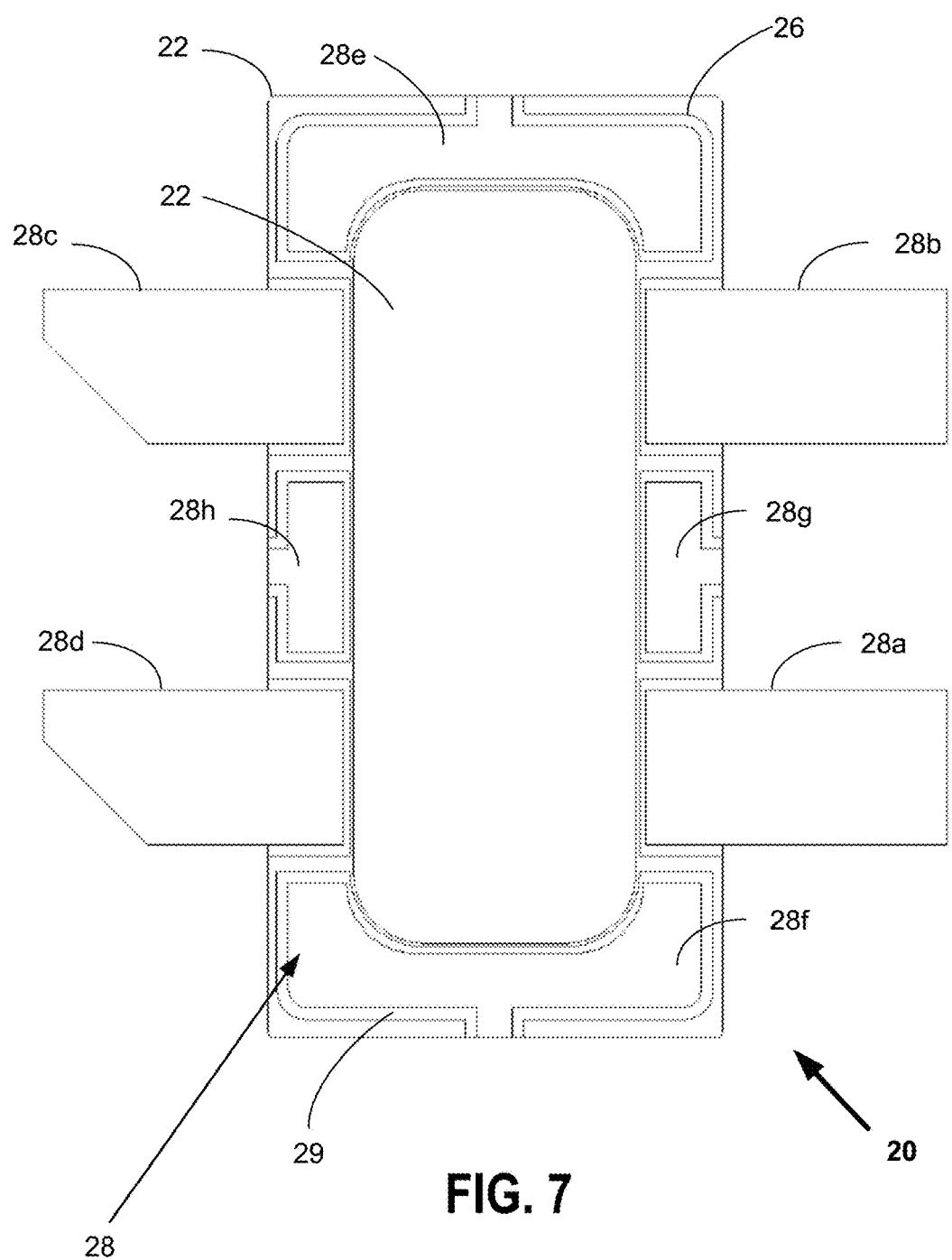
FIG. 7 is a top view of another lead package having a wrap around lead layer.

FIG. 7 is an illustration of a top view of another example lead layer 28 for a microelectronic package 20 also having a heat spreader 22, an insulator 26 and a buffer layer (not shown). A metallization layer 29 and the lead layer 28 provide metal coverage area to balance with the buffer layer (not shown). That is, as described with reference to the example package 10 in FIG. 5, the buffer layer 4 footprint on a bottom surface of the insulator 6 is matched by the footprint of the lead layer 8 on a top surface of the insulator 6 to provide symmetry in order to minimize deflection of the three-layer structure during the brazing process. Similarly, in the microelectronic package 20 illustrated in FIG. 7, the lead layer 28 brazed to the top surface of the insulator 26 includes multiple sections 28a, 28b, 28c, 28d, 28e, 28f, 28g, 28h that provide symmetry with the buffer layer (not shown). As illustrated lead layer section 28e and 28f wrap around the lengthwise end sections of the lead layer 28. Lead sections 28a, 28b, 28c and 28d are the input/output leads for the package 20. Sections 28g and 28h are located between the leads 28a, 28b, 28c and 28d. The gap size between the lead layer sections and metallization-to metallization separation and locations may vary in other lead layer examples.

The example lead layer of FIG. 7 is designed to manage electrical induction between leads. The example package 10 shown in FIG. 5 provides the lowest cost option for reasons including that the number of lead layer sections is minimized. Other lead layers may have any number of leads and lead sections in the footprints, such that maximum lead surface area coverage is obtained on an insulator top surface to provide a balanced symmetrical structure (S1 as shown in FIG. 2). In all considered lead layer designs, the buffer layer 4 brazed to the bottom surface of the insulator maintains a same footprint.

Clearly, other embodiments and modifications of this invention will occur readily to those of ordinary skill in the art in view of these teachings. The above description is illustrative and not restrictive. This invention is to be limited only by the following claims, which include all such embodiments and modifications when viewed in conjunction with the above specification and accompanying drawings. The scope of the invention should, therefore, be determined not with reference to the above description, but instead should be determined with reference to the appended claims along with their full scope of equivalents.

What is claimed is:

1. A lead package comprising:
   a three-layer structure bonded by a first braze comprising:
      an insulator layer comprising a rectangular frame body with a center cavity, an insulator top surface, and an insulator bottom surface;
      a buffer layer bonded by the first braze to the insulator bottom surface, the buffer layer having a rectangular frame body that extends around the insulator bottom surface, the buffer layer comprising a buffer bottom surface; and
      a lead layer bonded by the first braze to the insulator top surface, the lead layer having a rectangular frame body that that extends around the insulator top surface, the lead layer comprising a plurality of lead layer sections separated by gaps; and
   a heat spreader bonded to the buffer bottom surface by a second braze.

2. The lead package of claim 1, wherein at least two lead layer sections of the plurality of lead layer sections extend outward from the lead layer rectangular frame body to form at least two leads.

3. The lead package of claim 1, wherein the lead layer and the buffer layer are made of a same electrically conductive material.

4. The lead package of claim 3, wherein the lead layer and the buffer layer are a same thickness.

5. The lead package of claim 1, wherein the insulator layer is ceramic.

6. The lead package of claim 1, wherein the first braze is a high temperature braze, and the second braze is a high temperature braze having a lower melting point than the first braze.

7. The lead package of claim 1, wherein the lead layer and the buffer layer form symmetrically balanced footprints on the top surface and on the bottom surface of the insulator layer to symmetrically balance the three-layer structure.

8. The lead package of claim 7, wherein the symmetrically balanced three-layer structure has minimal convex/concave camber.

9. The lead package of claim 1, wherein a stiffness of the three-layer structure is greater than a stiffness of the heat spreader, and wherein a camber of the first and second brazed lead package is minimize in a convex direction.

10. The lead package of claim 9, wherein the heat spreader provides direct thermal paths from devices, housed in the cavity and on the heater spreader, to a second level assembly in contact with a bottom surface of the heat spreader.

11. A method for making a lead package comprising:
   concurrently bonding, using a first braze, a lead layer to a top surface of an insulator, and a buffer layer to a bottom surface of the insulator to form a three-layer frame structure having a center cavity, wherein the buffer layer extends around the insulator bottom surface, and wherein the lead layer extends around the insulator top surface and comprises a plurality of lead layer sections separated by gaps; and
   bonding, using a second braze, a heat spreader to a buffer bottom surface, and wherein the second braze has a lower melting point than the first braze.

12. The method of claim 11, wherein at least two lead layer sections of the plurality of lead layer sections extend outward from the lead layer to form at least two leads.

13. The method of claim 11, wherein the lead layer and the buffer layer are made of a same electrically conductive material.

14. The method of claim 13, wherein the lead layer and the buffer layer are a same thickness.

15. The method of claim 11, wherein the insulator is a ceramic.

16. The method of claim 11, wherein the first braze is a high temperature braze, and the second braze is a high temperature braze having a lower melting point than the first braze.

17. The method of claim 11, wherein the lead layer and the buffer layer form similar footprints on the top surface and the bottom surface of the insulator to symmetrically balance the three-layer structure.

18. The method of claim 16, wherein the symmetrically balanced three-layer structure has minimal convex/concave camber.

19. The method of claim 11, wherein a stiffness of the three-layer frame structure is greater than a stiffness of the heat spreader, and wherein a camber of the first and second brazed lead package is minimize in a convex direction.

20. The lead package of claim 19, wherein the heat spreader provides direct thermal paths from devices, housed in the center cavity and on the heater spreader, to a second level assembly in contact with a bottom surface of the heat spreader.

* * * * *